(12) United States Patent
Zhang

(10) Patent No.: US 10,749,036 B2
(45) Date of Patent: Aug. 18, 2020

(54) OXIDE SEMICONDUCTOR THIN FILM TRANSISTOR HAVING SPACED CHANNEL AND BARRIER STRIPS AND MANUFACTURING METHOD THEREOF

(71) Applicant: Shenzhen China Star Optoelectronics Technology Co., Ltd., Shenzhen (CN)

(72) Inventor: Qianyi Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/300,580

(22) PCT Filed: Sep. 27, 2018

(86) PCT No.: PCT/CN2018/107825
§ 371 (c)(1),
(2) Date: Nov. 11, 2018

(87) PCT Pub. No.: WO2020/024411
PCT Pub. Date: Feb. 6, 2020

(65) Prior Publication Data
US 2020/0044089 A1    Feb. 6, 2020

(30) Foreign Application Priority Data
Aug. 3, 2018  (CN) .......................... 2018 1 0879702

(51) Int. Cl.
*H01L 29/10*    (2006.01)
*H01L 29/12*    (2006.01)
(Continued)

(52) U.S. Cl.
CPC .... *H01L 29/7869* (2013.01); *H01L 29/66969* (2013.01); *H01L 29/78603* (2013.01); *H01L 29/78696* (2013.01); *H01L 27/1225* (2013.01)

(58) Field of Classification Search
CPC ........... H01L 29/7869; H01L 29/78603; H01L 29/78696; H01L 29/66969; H01L 27/1225
See application file for complete search history.

(56) References Cited

U.S. PATENT DOCUMENTS 6,413,802 B1 * 7/2002 Hu ........................ H01L 21/845
                                                              438/151
7,611,932 B2 * 11/2009 Yin ..................... H01L 21/2026
                                                              438/166
(Continued)

FOREIGN PATENT DOCUMENTS

CN          1549349 A      11/2004
CN        102347369 A       2/2012
(Continued)

*Primary Examiner* — Ismail A Muse
(74) *Attorney, Agent, or Firm* — Leong C. Lei

(57) ABSTRACT

The invention provides an oxide semiconductor TFT and manufacturing method thereof. The oxide semiconductor TFT comprises: a substrate, a gate on the substrate, a gate insulating layer on the gate and substrate, an oxide semiconductor layer on the gate insulating layer, and a barrier layer on the semiconductor layer, and a source and a drain on the oxide semiconductor layer and gate insulating layer; the oxide semiconductor layer comprising: a channel region and two contact regions respectively located at two sides of the channel region, and the barrier layer being located on the channel region; the channel region comprising a plurality of channel strips spaced apart in a channel width direction, and the barrier layer comprising a plurality of barrier strips respectively corresponding to the plurality of channel strips.

(Continued)

The invention can reduce power consumption of the oxide semiconductor TFT and improve and the stability in the winding state.

8 Claims, 15 Drawing Sheets

(51) Int. Cl.
*H01L 29/786* (2006.01)
*H01L 29/66* (2006.01)
*H01L 27/12* (2006.01)

(56) References Cited

U.S. PATENT DOCUMENTS

| | | | | |
|---|---|---|---|---|
| 8,273,626 B2* | 9/2012 | Hareland | ........ | H01L 29/42384 257/E21.415 |
| 2006/0084204 A1* | 4/2006 | Yin | ........ | H01L 21/84 438/149 |
| 2006/0172497 A1* | 8/2006 | Hareland | ........ | H01L 29/66772 438/286 |
| 2007/0075372 A1* | 4/2007 | Terashima | ........ | H01L 29/42392 257/360 |
| 2009/0061572 A1* | 3/2009 | Hareland | ........ | H01L 29/66772 438/157 |
| 2011/0195554 A1* | 8/2011 | Wang | ........ | H01L 21/76802 438/294 |
| 2011/0312163 A1* | 12/2011 | Romano | ........ | B82Y 10/00 438/478 |
| 2012/0085991 A1* | 4/2012 | Cohen | ........ | B82Y 40/00 257/28 |
| 2014/0264324 A1* | 9/2014 | Yamazaki | ........ | H01L 29/7869 257/43 |
| 2017/0054029 A1* | 2/2017 | Koezuka | ........ | H01L 21/02557 |
| 2017/0141236 A1* | 5/2017 | Wu | ........ | H01L 29/78696 |
| 2017/0271524 A1* | 9/2017 | Wu | ........ | H01L 21/02592 |
| 2017/0301797 A1* | 10/2017 | Yamazaki | ........ | H01L 29/7869 |
| 2018/0145153 A1* | 5/2018 | Yamazaki | ........ | H01L 21/02565 |

FOREIGN PATENT DOCUMENTS

| | | |
|---|---|---|
| CN | 104916779 A | 9/2015 |
| CN | 108496253 A | 9/2018 |

* cited by examiner

OXIDE SEMICONDUCTOR THIN FILM TRANSISTOR HAVING SPACED CHANNEL AND BARRIER STRIPS AND MANUFACTURING METHOD THEREOF

BACKGROUND OF THE INVENTION

1. Field of the Invention

The present invention relates to the field of display and, in particular, to the field of oxide semiconductor thin film transistor (TFT) and manufacturing method thereof.

2. The Related Arts

Liquid crystal display (LCD) provides many advantages such as thinness, power saving, and no radiation, and has been widely used. Most of the LCD devices on the market are backlight type LCD devices, which comprises an LCD panel and a backlight module. The operation principle of the LCD panel is to place liquid crystal (LC) molecules in two parallel glass substrates, and to control the LC molecules to change direction to refract the light of the backlight module to produce an image by supplying electricity or not the glass substrates.

Generally, the LCD panel comprises a color filter (CF) substrate, a TFT substrate, an LC sandwiched between the CF substrate and the TFT substrate, and a sealant. The manufacturing process generally comprises: an array process (thin film, yellow light, etching and peeling), a cell process (attaching a TFT substrate to a CF substrate), and a module assembly process (press driving IC and printed circuit board together). The array process at the front phase mainly forms a TFT substrate to control the movement of LC molecules; the cell process in the middle mainly adds LC between the TFT substrate and the CF substrate; the module assembly process at the end phase is mainly to press the driving IC and the printed circuit board (PCB) together so as to drive the LC molecules to rotate to display an image.

The TFT substrate generally comprises a glass substrate and a TFT array formed on the glass substrate. The TFT technologies commonly used in the prior art include amorphous germanium (a-Si) TFT and a low temperature polysilicon (LTPS) TFT and oxide semiconductor TFT, wherein the oxide semiconductor TFT, due to high electron mobility, and a simpler manufacturing process compared to LTPS TFT and more compatibility with a-Si TFT manufacturing process, has been widely used.

With the development of display technology, users have higher and higher demands on terminal display screens. Flexible display devices have been favored and sought after by users. There are some difficulties in applying oxide semiconductor TFT to flexible display devices, specifically, the oxide semiconductor TFT is subjected to external stress during the winding, and the long-term external application causes changes in the positive bias temperature stress (PBTS) and the subthreshold swing (SS) of the oxide semiconductor TFT, resulting in lower stability of the device. At the same time, due to the large number of oxygen vacancies in the oxide semiconductor material, the electronic defects are large, resulting in less stability of the device.

SUMMARY OF THE INVENTION

The primary object of the present invention is to provide an oxide semiconductor TFT, able to reduce power consumption of the oxide semiconductor TFT, and improve stability of the oxide semiconductor TFT in a winding state.

Another object of the present invention is to provide a manufacturing method of oxide semiconductor TFT, able to reduce power consumption of the oxide semiconductor TFT, and improve stability of the oxide semiconductor TFT in a winding state.

To achieve the above objects, the present invention provides an oxide semiconductor TFT, which comprises: a substrate, a gate disposed on the substrate, a gate insulating layer disposed on the gate and the substrate, an oxide semiconductor layer disposed on the gate insulating layer, and a barrier layer disposed on the semiconductor layer, and a source and a drain disposed on the oxide semiconductor layer and the gate insulating layer;

the oxide semiconductor layer comprising: a channel region and two contact regions respectively located at two sides of the channel region, wherein the source and the drain respectively in contact with the two contact regions, and the barrier layer being located on the channel region;

the channel region comprising a plurality of channel strips spaced apart in a channel width direction, and the barrier layer comprising a plurality of barrier strips respectively corresponding to the plurality of channel strips.

The substrate is a flexible substrate.

The interface between the channel region and the barrier layer comprises fluoride ions that occupy oxygen vacancies in the channel region.

The material of the oxide semiconductor layer is IGZO.

The material of the barrier layer is silicon oxide.

The present invention also provides a manufacturing method of oxide semiconductor TFT, comprising the steps of:

Step S1: providing a base substrate, forming a substrate on the base substrate;

Step S2: forming a gate on the substrate, forming a gate insulating layer on the gate and the substrate;

Step S3: forming an oxide semiconductor film on the gate insulating layer, and forming a barrier film on the oxide semiconductor film;

Step S4: patterning the oxide semiconductor film and the barrier film to obtain an oxide semiconductor layer and a barrier layer; the oxide semiconductor layer comprising: a channel region and two contact regions respectively located at two sides of the channel region, the barrier layer being located on the channel region; the channel region comprising a plurality of channel strips spaced apart in a channel width direction, and the barrier layer comprising a plurality of barrier strips respectively corresponding to the plurality of channel strips;

Step S5: forming a source and a drain in the oxide semiconductor layer and the gate insulating layer, wherein the source and the drain being in contact with the two contact regions, respectively.

In step S4 of patterning the oxide semiconductor film and the barrier film, a fluorine-containing gas is used to etch the barrier film.

The manufacturing method further comprises a step S6 of baking the barrier layer.

The substrate is a flexible substrate.

The material of the channel region is IGZO, and the material of the barrier layer is silicon oxide.

The present invention provides the following advantages: the present invention provides an oxide semiconductor TFT, comprising: a substrate, a gate disposed on the substrate, a gate insulating layer disposed on the gate and the substrate, an oxide semiconductor layer disposed on the gate insulating layer, and a barrier layer disposed on the semiconductor layer, and a source and a drain disposed on the oxide semiconductor layer and the gate insulating layer; the oxide semiconductor layer comprising: a channel region and two contact regions respectively located at two sides of the channel region, wherein the source and the drain respectively in contact with the two contact regions, and the barrier layer being located on the channel region; the channel region comprising a plurality of channel strips spaced apart in a channel width direction, and the barrier layer comprising a plurality of barrier strips respectively corresponding to the plurality of channel strips. By splitting the channel region into a plurality of channel strips, the power consumption of the oxide semiconductor TFT is reduced, and the stability of the oxide semiconductor TFT in the winding state is improved so that the oxide semiconductor TFT can be applied to the bendable device. The invention also provides a manufacturing method of oxide semiconductor TFT, able to reduce the power consumption of the oxide semiconductor TFT and improve the stability of the oxide semiconductor TFT in a winding state.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

Figure 1:
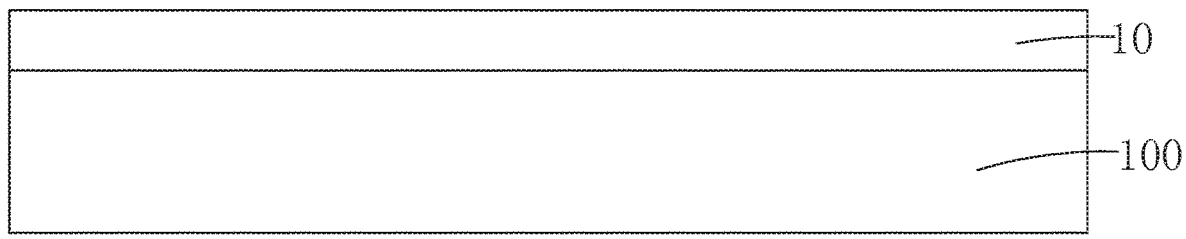
FIG. 1 is a schematic view showing step S1 of the manufacturing method of oxide semiconductor TFT of the present invention.

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Figure 19:
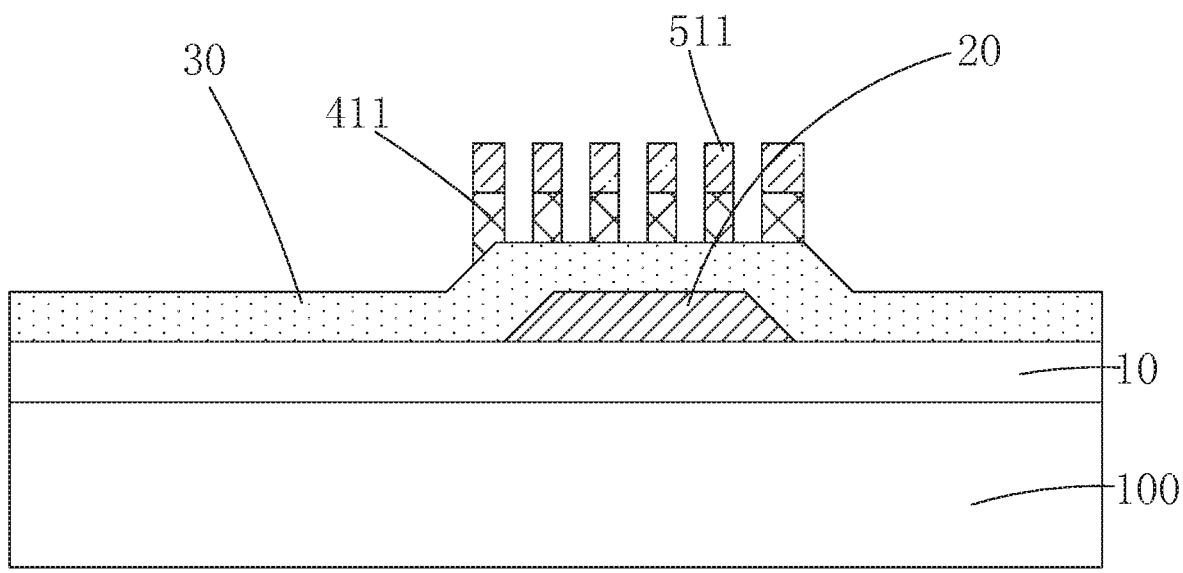

Refer to FIG. 17 to FIG. 20. The present invention provides an oxide semiconductor TFT, which comprises: a substrate 10, a gate 20 disposed on the substrate 10, a gate insulating layer 30 disposed on the gate 20 and the substrate 10, an oxide semiconductor layer 40 disposed on the gate insulating layer 30, and a barrier layer 50 disposed on the semiconductor layer 40, and a source 60 and a drain 70 disposed on the oxide semiconductor layer 40 and the gate insulating layer 30;

the oxide semiconductor layer 40 comprises: a channel region 41 and two contact regions 42 respectively located at two sides of the channel region 41, wherein the source 60 and the drain 70 respectively in contact with the two contact regions 42, and the barrier layer 50 being located on the channel region;

as shown in FIG. 19, the channel region 41 comprises a plurality of channel strips 411 spaced apart in a channel width direction, and the barrier layer 50 comprises a plurality of barrier strips 511 respectively corresponding to the plurality of channel strips 411.

Specifically, the substrate 10 is a flexible substrate. The material is preferably polyimide (PI), and by using a substrate made of a flexible material, the oxide semiconductor TFT can be bent.

Specifically, the material of the gate 20 is a combination of one or more of molybdenum, titanium, and copper. Preferably, the material of the gate 20 is a combination of copper and molybdenum, specifically, a layer of molybdenum film superimposed on a layer of copper film wherein the thickness of the copper film is 500 nm and the thickness of the molybdenum film is 140 nm.

Specifically, the material of the gate insulating layer 30 is one of or a combination of silicon oxide or silicon nitride. Preferably, the gate insulating layer 30 is a stacked structure of silicon nitride and silicon oxide, wherein the thickness of silicon oxide is 280 nm, the thickness of silicon nitride is 140 nm, and the oxide is stacked on the silicon nitride.

Specifically, the material of the oxide semiconductor layer 40 is indium gallium zinc oxide (IGZO) having a thickness of 450 nm.

Specifically, the material of the barrier layer 50 is silicon oxide and has a thickness of 100 nm.

Specifically, the material of the source 60 and the drain 70 is a combination of one or more of molybdenum, titanium and copper. Preferably, the material of the source 60 and the drain 70 is a combination of copper and molybdenum, a combination of copper and molybdenum, specifically, a layer of molybdenum film superimposed on a layer of copper film wherein the thickness of the copper film is 400 nm, and the thickness of the molybdenum film is 30 nm.

It should be noted that, in the oxide semiconductor TFT of the present invention, the channel region 41 in the oxide semiconductor layer 40 is divided into a plurality of spaced-apart channel strips 411, which can reduce contact resistance and channel resistance, reduce the driving voltage, reduce the power consumption of the device, and lower the interface state density of the channel region 41, so that the current-voltage curve, the threshold voltage, and the sub-threshold swing amplitude of the oxide semiconductor TFT in the winding state are substantially consistent with the non-winding state, and the stability of the oxide semiconductor TFT when applied to a winding device such as a winding wearing device is improved.

It is worth noting that, to further improve the operational stability of the oxide semiconductor TFT, the present invention also provides fluorine ions at the interface between the channel region 41 and the barrier layer 50. Because the structures of the fluorine and oxygen atoms are similar, and the radii differences are also small, the fluoride ions can easily occupy the oxygen vacancies in the channel region 41, generate additional electrons, reduce electron defects in the channel region 41, and improve device stability and channel migration rate. In the specific implementation, the barrier layer 50 is etched by using a fluorine-containing gas, and the barrier layer 50 is baked at a high temperature after etching, and fluorine ions are generated at a boundary position between the channel region 41 and the barrier layer 50.

Figure 21:
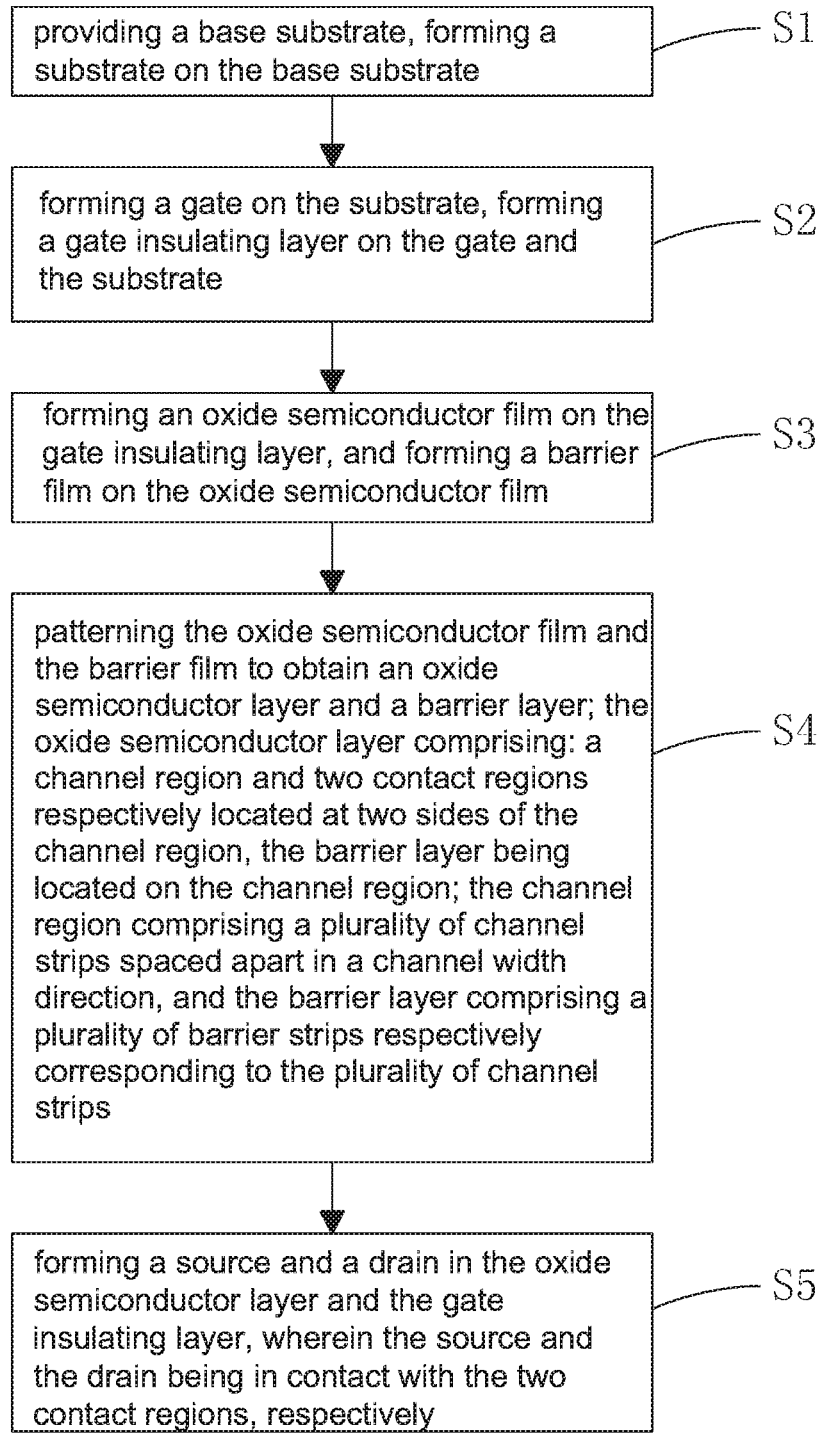
FIG. 21 is a schematic view the flowchart of the manufacturing method of oxide semiconductor TFT of the present invention.

Refer to FIG. 21. The present invention also provides a manufacturing method of oxide semiconductor TFT, comprising the steps of:

Step S1: as shown in FIG. 1, providing a base substrate 100, forming a substrate 10 on the base substrate 100.

Specifically, the base substrate 100 is a rigid glass substrate, and the substrate 10 is a flexible substrate. Preferably, the material of the substrate 10 is PI, and the step S1 forms the substrate 10 by a deposition process.

Figure 2:
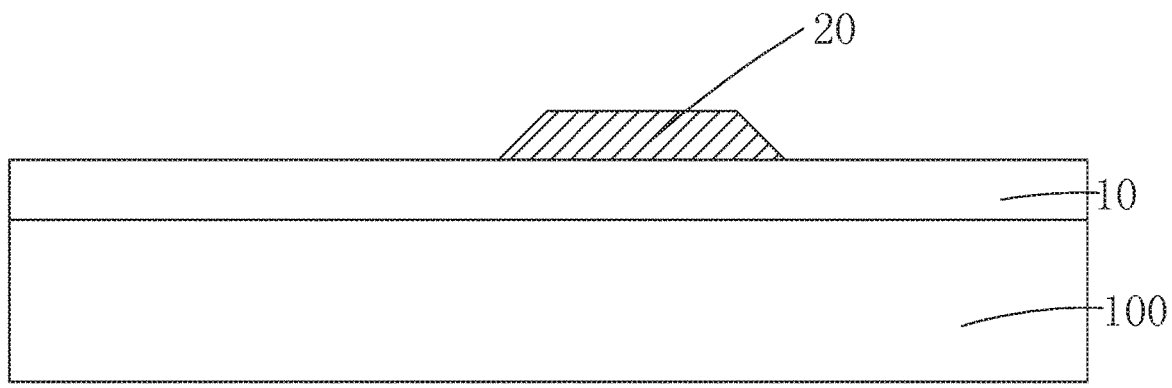
FIGS. 2-3 are schematic views showing step S2 of the manufacturing method of oxide semiconductor TFT of the present invention.
Figure 3:
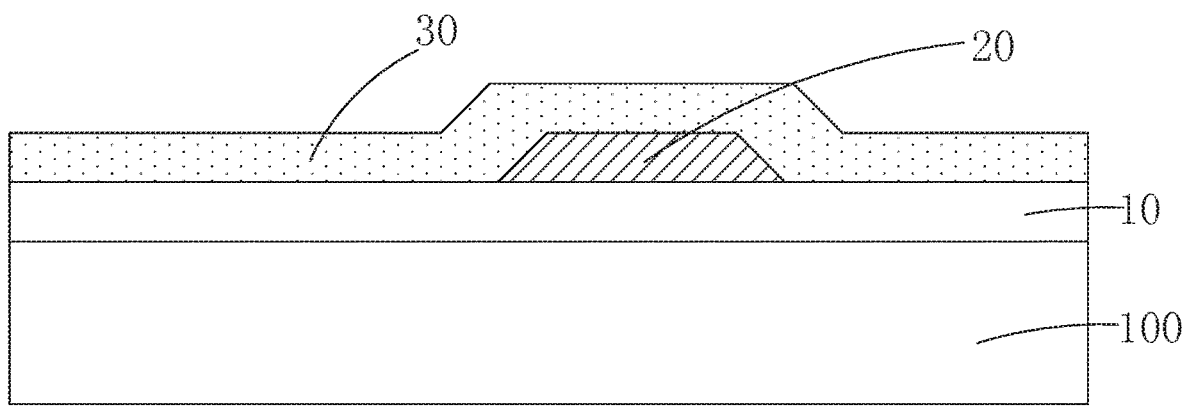

Step S2: as shown in FIG. 2 and FIG. 3, forming a gate 20 on the substrate 10, forming a gate insulating layer 30 on the gate 20 and the substrate 10.

Specifically, step S2 comprises: depositing a gate film on the substrate 10 by a physical vapor deposition process, and patterning the gate film through a photomask to form the gate 20, and then depositing the gate insulating layer 30 on the gate 20 and the substrate 10 by chemical vapor deposition.

Specifically, the material of the gate 20 is a combination of one or more of molybdenum, titanium, and copper. Preferably, the material of the gate 20 is a combination of copper and molybdenum, specifically, a layer of molybdenum film superimposed on a layer of copper film wherein the thickness of the copper film is 500 nm and the thickness of the molybdenum film is 140 nm.

Specifically, the material of the gate insulating layer 30 is one of or a combination of silicon oxide or silicon nitride. Preferably, the gate insulating layer 30 is a stacked structure of silicon nitride and silicon oxide, wherein the thickness of silicon oxide is 280 nm, the thickness of silicon nitride is 140 nm, and the oxide is stacked on the silicon nitride.

Figure 4:
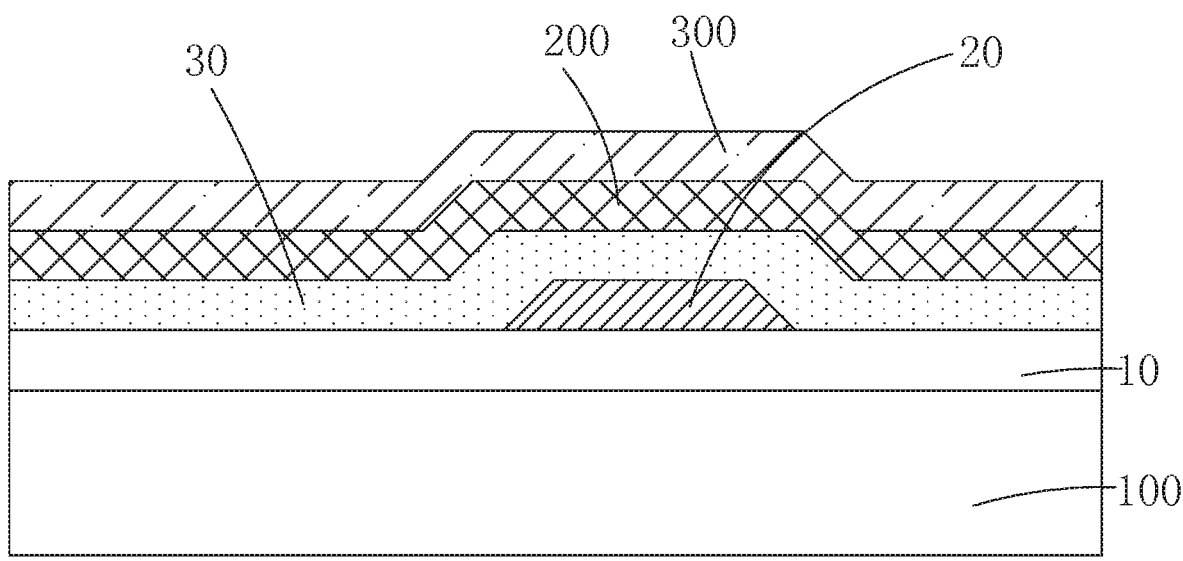
FIG. 4 is a schematic view showing step S3 of the manufacturing method of oxide semiconductor TFT of the present invention.

Step S3: as shown in FIG. 4, forming an oxide semiconductor film 200 on the gate insulating layer 30, and forming a barrier film 300 on the oxide semiconductor film 200.

Specifically, the material of the oxide semiconductor film 200 is IGZO and has a thickness of 450 nm, and the material of the barrier film 300 is silicon oxide and has a thickness of 100 nm.

Step S4: patterning the oxide semiconductor film 200 and the barrier film 300 to obtain an oxide semiconductor layer 40 and a barrier layer 50; the oxide semiconductor layer 40 comprising: a channel region 41 and two contact regions 42 respectively located at two sides of the channel region 41, the barrier layer 50 being located on the channel region 41; the channel region 41 comprising a plurality of channel strips 411 spaced apart in a channel width direction, and the barrier layer 50 comprising a plurality of barrier strips 511 respectively corresponding to the plurality of channel strips 411.

Figure 5:
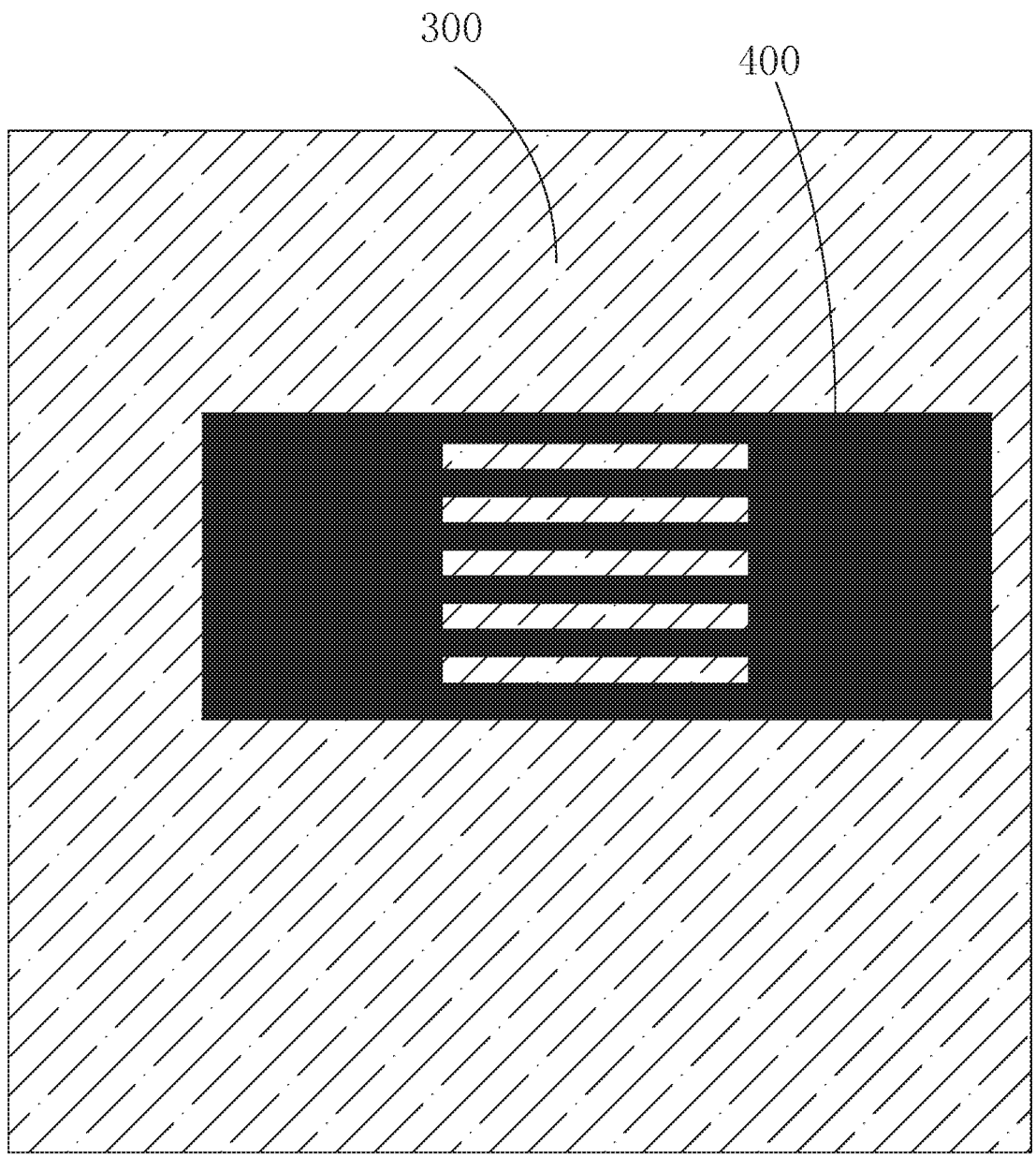
FIGS. 5-19 are schematic views showing step S4 of the manufacturing method of oxide semiconductor TFT of the present invention.
Figure 6:
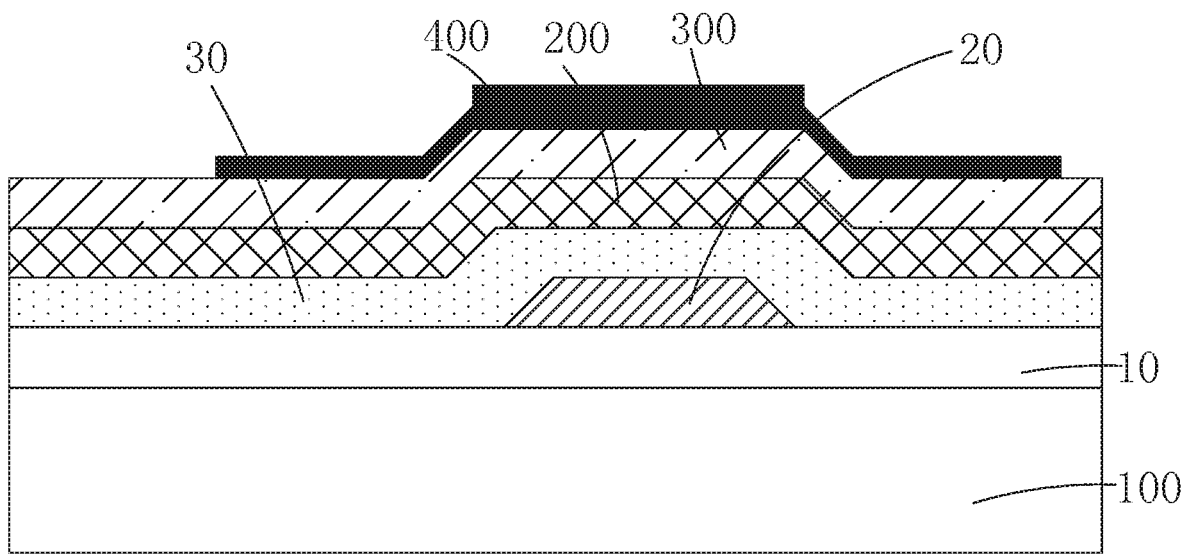
Figure 7:
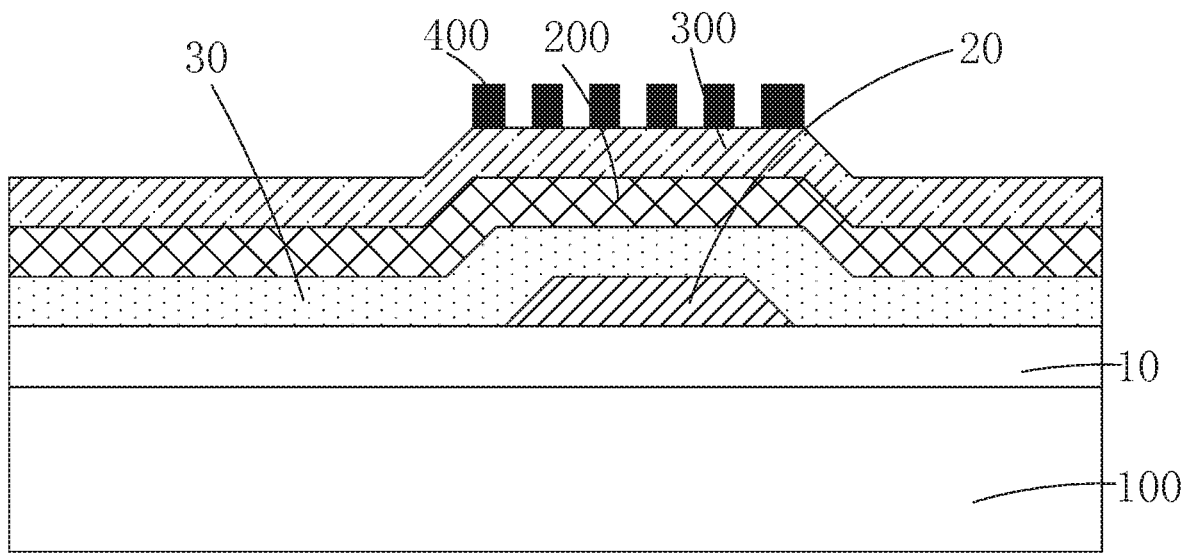
Figure 8:
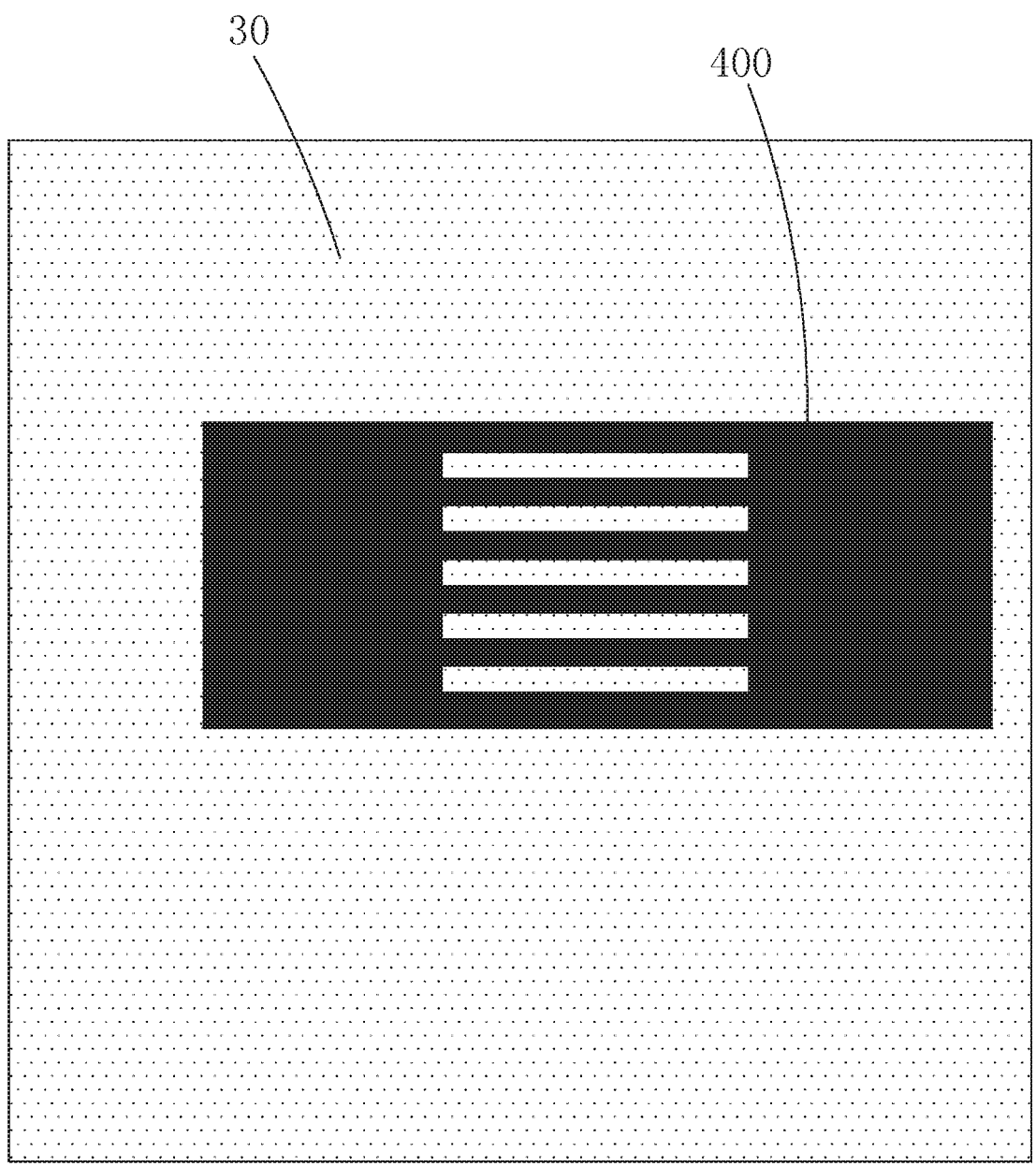
Figure 9:
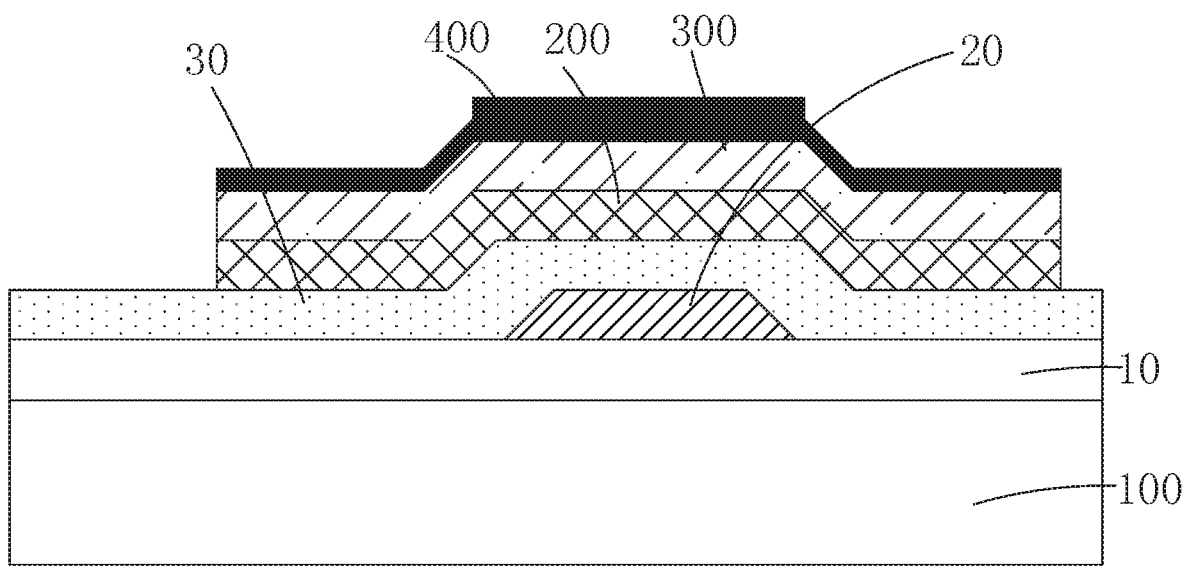
Figure 10:
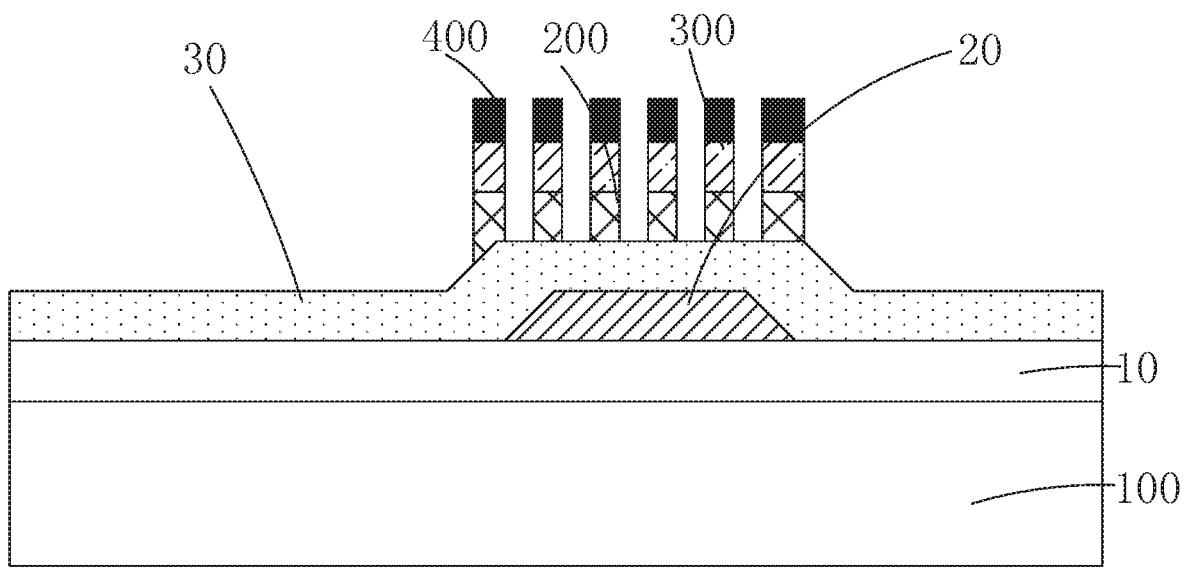

Specifically, step S4 further comprises:

as shown in FIG. 5 to FIG. 7, FIG. 5 showing a top view of the oxide semiconductor TFT post-processed in step 41, FIG. 6 showing a cross-sectional view of FIG. 5 along the channel length direction, and FIG. 7 showing a cross-sectional view of FIG. 5 along the channel width direction, Step 41 is to form a photoresist layer 400 on the barrier film 300, and pattern the photoresist layer 400 through a grayscale mask or a halftone mask, so that the photoresist layer 400 covers the contact regions 42 to be formed and the region where the channel strip 411 is to be formed, and the thickness of the photoresist layer 400 overlying the area where the contact regions 42 is to be formed is smaller than the thickness of the photoresist layer 400 overlying the region where the channel strip 411 is to be formed;

as shown in FIG. 8 to FIG. 10, FIG. 8 showing a top view of the oxide semiconductor TFT post-processed in step 42, FIG. 9 showing a cross-sectional view of FIG. 8 along the channel length direction, and FIG. 10 showing a cross-sectional view of FIG. 8 along the channel width direction, Step 42 is to use the photoresist film 400 as shielding, remove the barrier film 300 not shielded by the photoresist layer 400 by a first etching, and remove the oxide semiconductor film 200 not shielded by the photoresist layer 400 by a second etching, wherein the first etching uses the fluorine-containing gas to etch the barrier film 300, and the second etching etches the oxide semiconductor film 200 with oxalic acid or hydrogen peroxide ($H_2O_2$) acid.

Preferably, the fluorine-containing gas used in the first etching is a combination of nitrogen trifluoride ($NF_3$) and hydrogen ($H_2$) or a combination of carbon tetrafluoride ($CF_4$) and oxygen ($O_2$).

Figure 11:
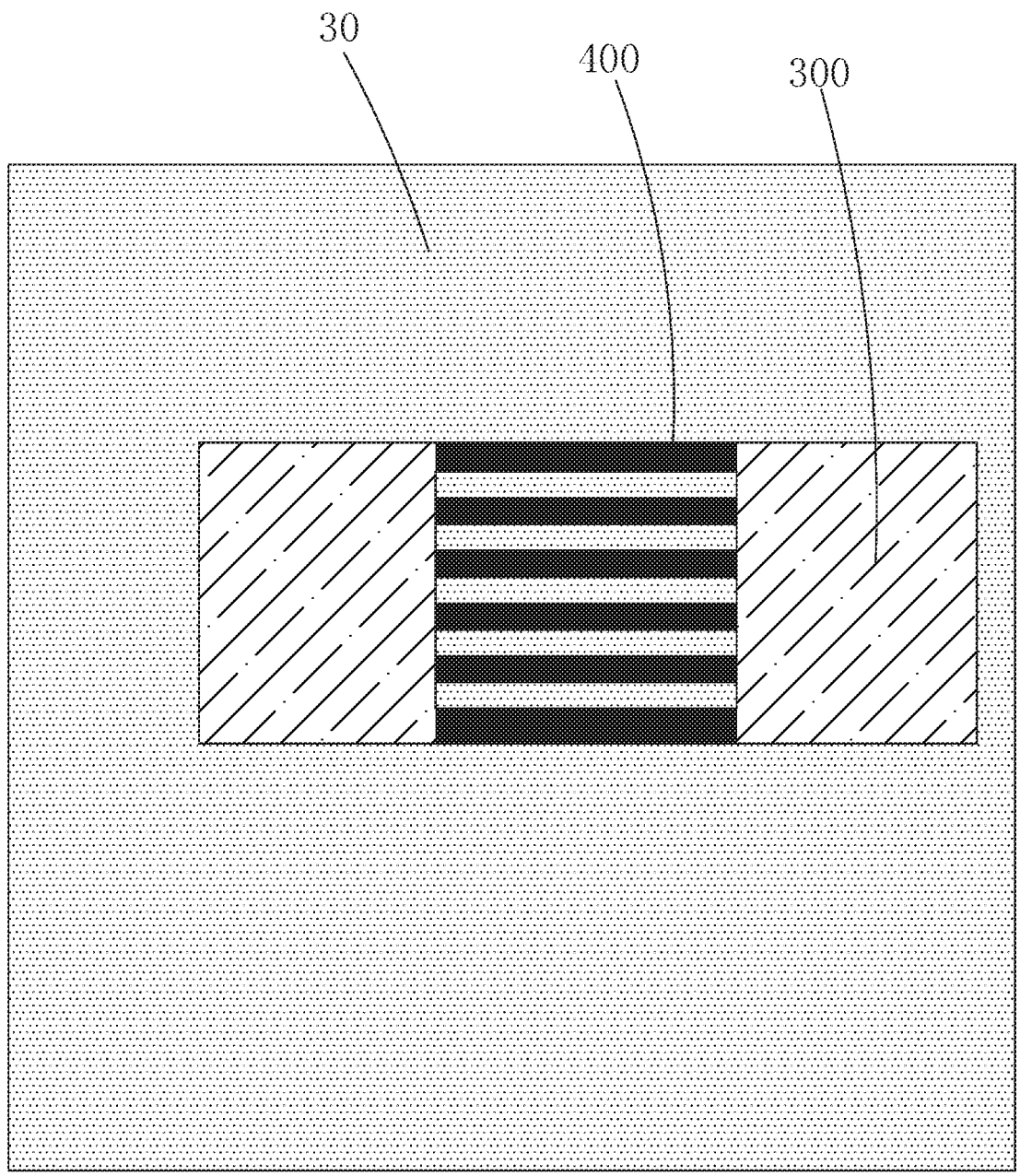
Figure 12:
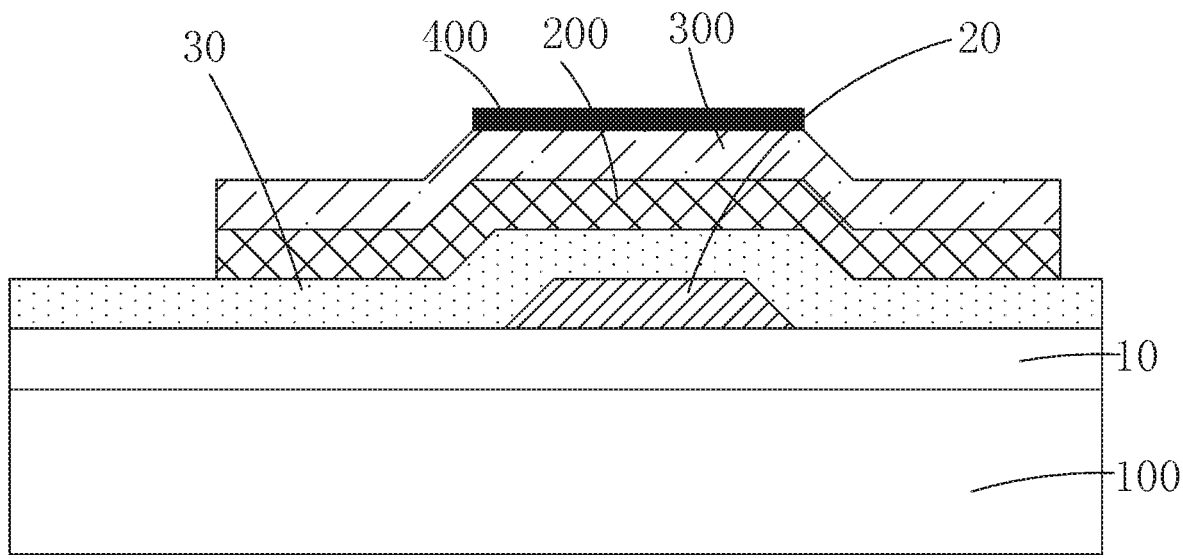
Figure 13:
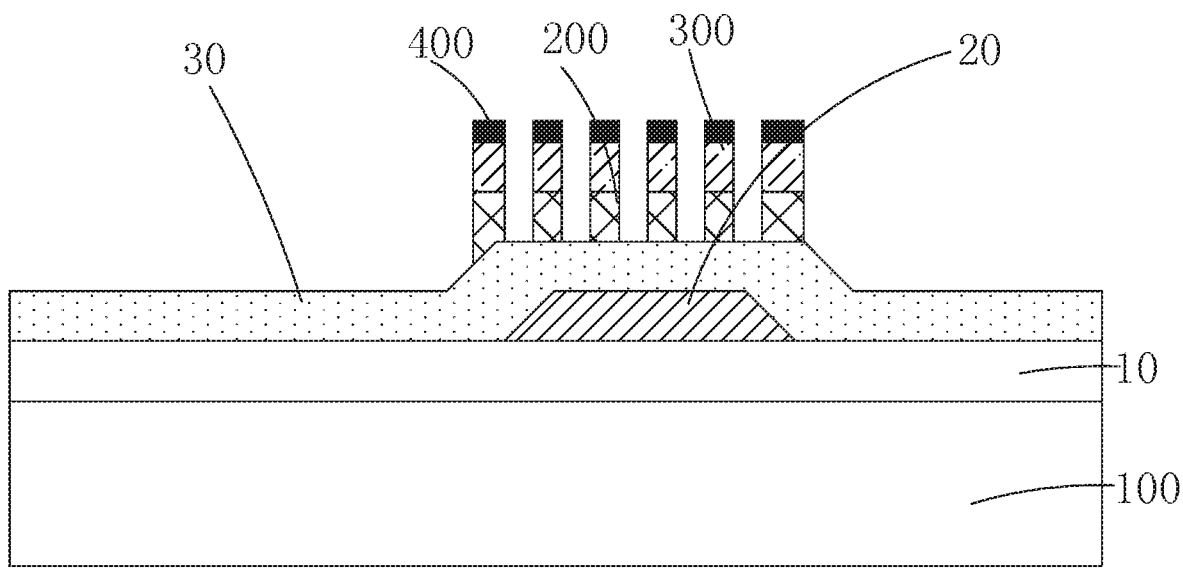

As shown in FIG. 11 to FIG. 13, FIG. 11 showing a top view of the oxide semiconductor TFT post-processed in step 43, FIG. 12 showing a cross-sectional view of FIG. 11 along the channel length direction, and FIG. 13 showing a cross-sectional view of FIG. 11 along the channel width direction, step 43 is to perform ashing treatment on the photoresist layer 400 to remove the photoresist layer 400 covering the region where the contact region 42 is to be formed, and at the same time thinning the photoresist layer 400 covering the region where the channel strip 411 is to be formed.

Figure 14:
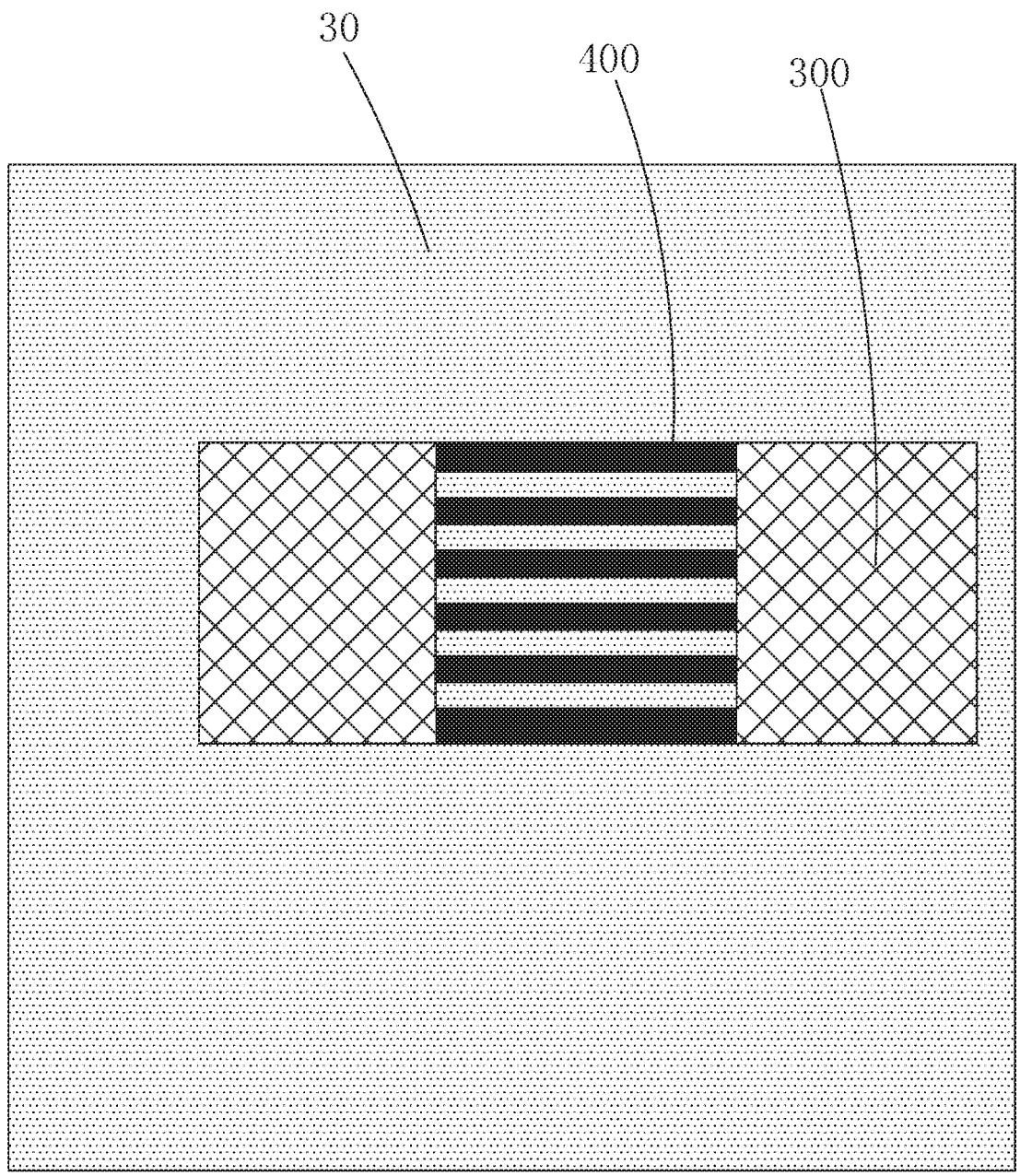
Figure 15:
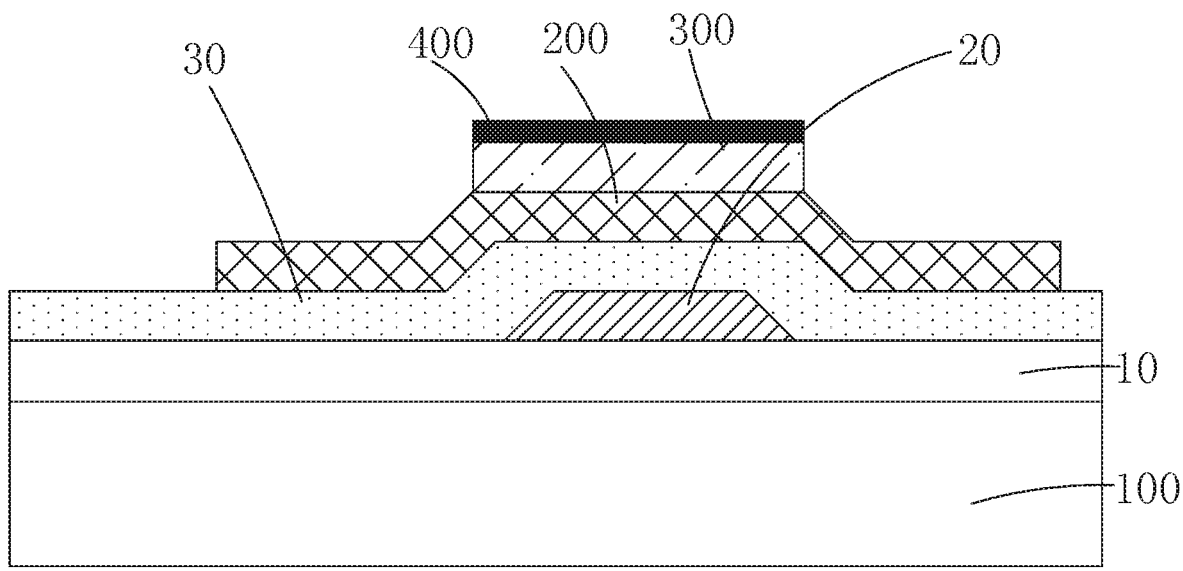
Figure 16:
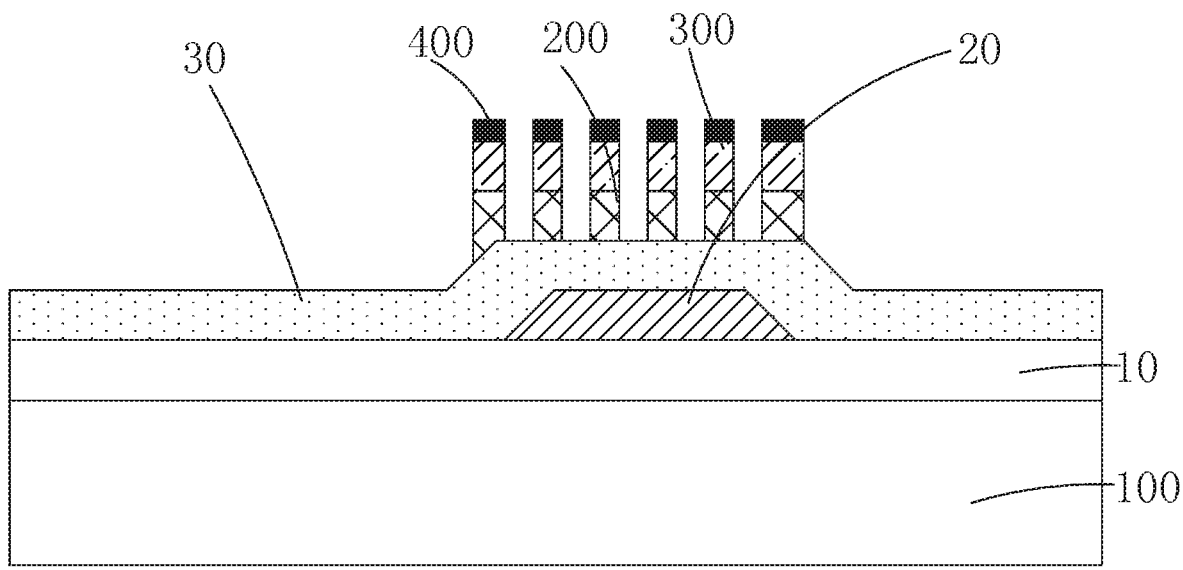

As shown in FIG. 14 to FIG. 16, FIG. 14 showing a top view of the oxide semiconductor TFT post-processed in step 44, FIG. 15 showing a cross-sectional view of FIG. 14 along the channel length direction, and FIG. 16 showing a cross-sectional view of FIG. 14 along the channel width direction, step 44 is to etch the barrier film 300 by using the remaining photoresist layer 400 as shielding to remove the barrier film 300 covering the region where the contact region 42 is to be formed, as in step 42, in step 44, the barrier film 300 may also be etched by using a fluorine-containing gas. Preferably, the fluorine-containing gas is a composition of the fluorine-containing gas used for the first etching, which is a combination of nitrogen trifluoride and hydrogen or a combination of carbon tetrafluoride and oxygen.

Figure 17:
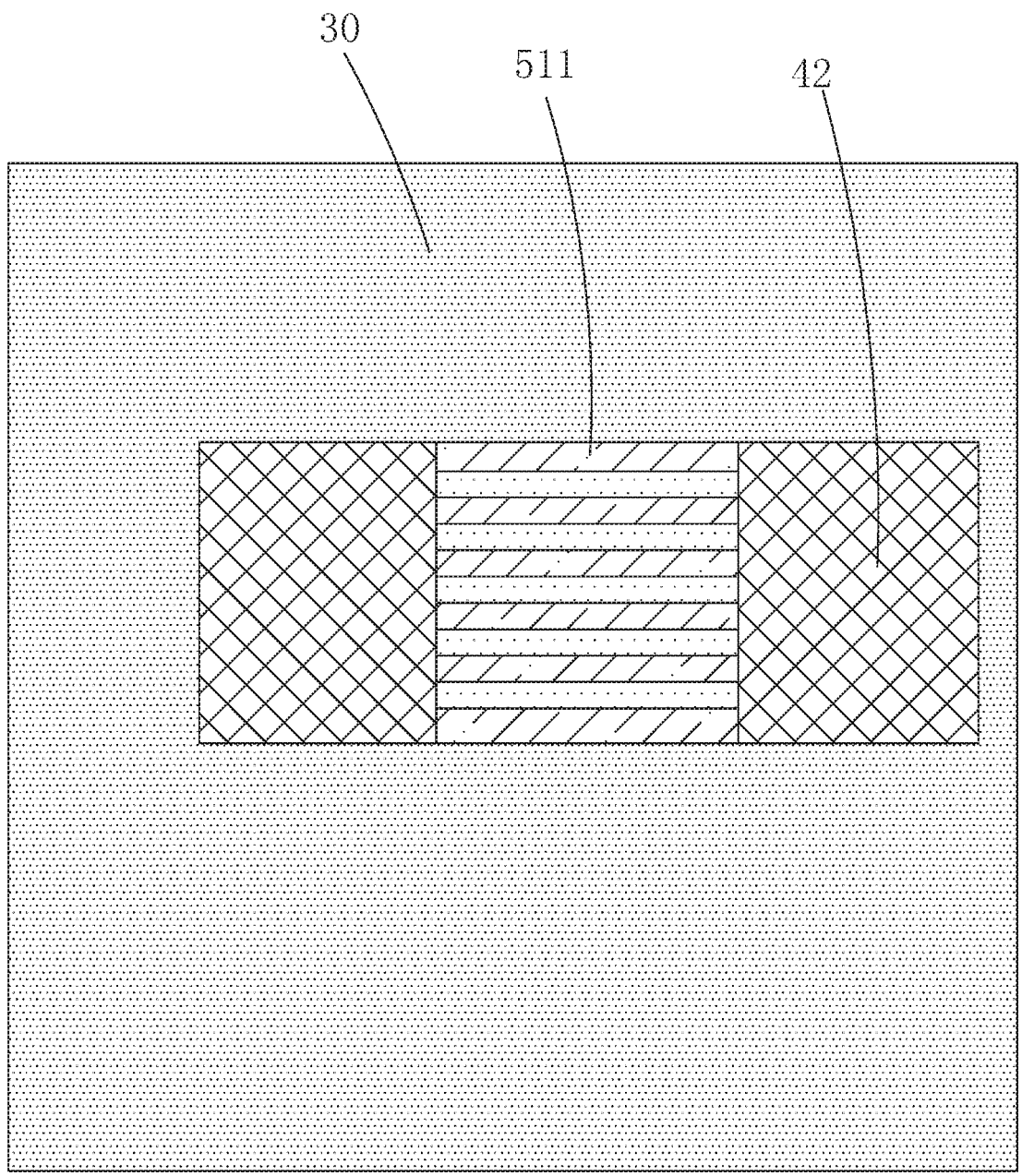
Figure 18:
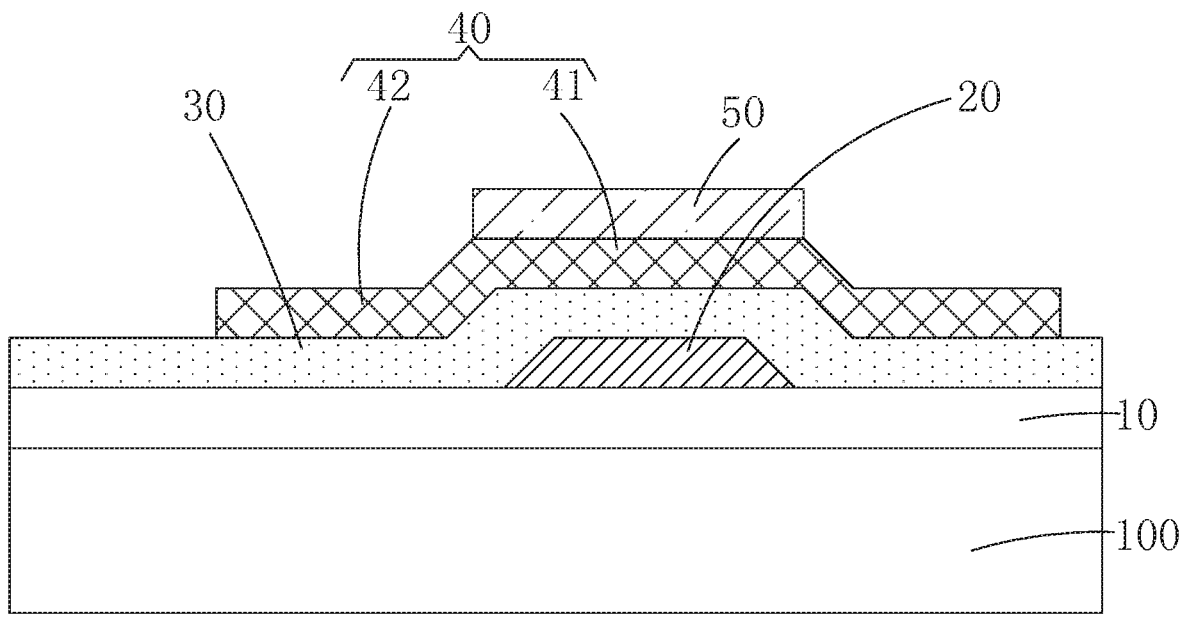

As shown in FIG. 17 to FIG. 19, FIG. 17 showing a top view of the oxide semiconductor TFT post-processed in step 45, FIG. 18 showing a cross-sectional view of FIG. 17 along the channel length direction, and FIG. 19 showing a cross-sectional view of FIG. 17 along the channel width direction, step 45 is to remove the remaining photoresist layer 400 completely.

Step S5: forming a source 60 and a drain 70 in the oxide semiconductor layer 40 and the gate insulating layer 30, wherein the source 60 and the drain 70 being in contact with the two contact regions 42, respectively.

Specifically, the material of the source 60 and the drain 70 is a combination of one or more of molybdenum, titanium and copper. Preferably, the material of the source 60 and the drain 70 is a combination of copper and molybdenum, a combination of copper and molybdenum, specifically, a layer of molybdenum film superimposed on a layer of copper film wherein the thickness of the copper film is 400 nm, and the thickness of the molybdenum film is 30 nm.

Specifically, step S5 comprises: depositing a source/drain film by a physical vapor deposition process, and patterning the source/drain film with a photomask to form the source 60 and the drain 70. During the patterning process, the source/drain film is etched using a ketone acid which is not fluorine-containing in hydrogen peroxide.

Figure 20:
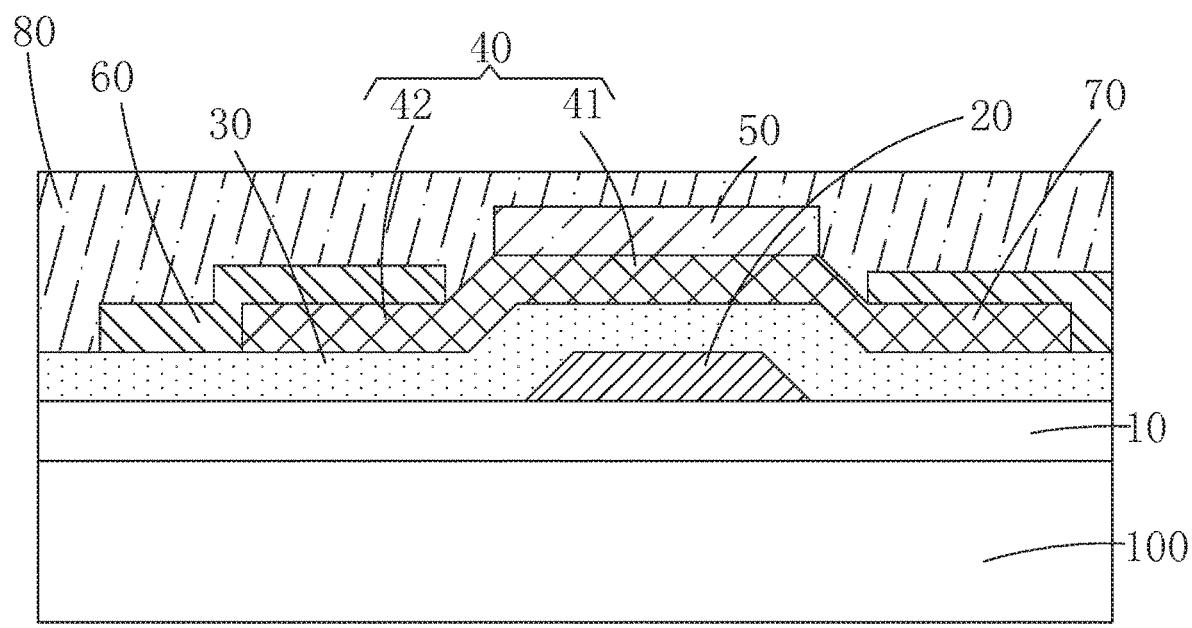
FIG. 20 is a schematic view showing step S5 of the manufacturing method of oxide semiconductor TFT and the structure of the oxide semiconductor TFT of the present invention.

Moreover, as shown in FIG. 20, the manufacturing method further comprises a step S6, wherein after forming the source 60 and the drain 70, baking the barrier layer 50; and after the baking, forming a passivation layer 80 on the source 60, the drain 70, the barrier layer 50, the oxide semiconductor layer 40, and the gate insulating layer 30; and a step S7, wherein the substrate 100 is removed to obtain a bendable oxide semiconductor TFT.

It should be noted that, in the manufacturing method of the oxide semiconductor TFT of the present invention, a patterning process is used to divide the channel region 41 in the oxide semiconductor layer 40 into a plurality of spaced-apart channel strips 411, which can reduce contact resistance and channel resistance, reduce the driving voltage, reduce the power consumption of the device, and lower the interface state density of the channel region 41, so that the current-voltage curve, the threshold voltage, and the sub-threshold swing amplitude of the oxide semiconductor TFT in the winding state are substantially consistent with the non-winding state, and the stability of the oxide semiconductor TFT when applied to a winding device such as a winding wearing device is improved.

It is worth noting that the present invention uses a fluorine-containing gas to etch the barrier film 300, and the fluoride ions adhere to the sidewall of the barrier layer 50 after etching, and the fluoride ions diffuse from the sidewall of the barrier layer 50 to the channel region 41 after the subsequent baking. At the interface with the barrier layer 50, since the atomic structures of fluorine and oxygen are similar, the radius difference is also small, so that the fluoride ions can easily occupy the oxygen vacancies in the channel region 41, generate additional electrons, and lower the channel region. 41 electronic defects improve device stability and channel migration rate.

In summary, the present invention provides the following advantages: the present invention provides an oxide semiconductor TFT, comprising: a substrate, a gate disposed on the substrate, a gate insulating layer disposed on the gate and the substrate, an oxide semiconductor layer disposed on the gate insulating layer, and a barrier layer disposed on the semiconductor layer, and a source and a drain disposed on the oxide semiconductor layer and the gate insulating layer; the oxide semiconductor layer comprising: a channel region and two contact regions respectively located at two sides of the channel region, wherein the source and the drain respectively in contact with the two contact regions, and the barrier layer being located on the channel region; the channel region comprising a plurality of channel strips spaced apart in a channel width direction, and the barrier layer comprising a plurality of barrier strips respectively corresponding to the plurality of channel strips. By splitting the channel region into a plurality of channel strips, the power consumption of the oxide semiconductor TFT is reduced, and the stability of the oxide semiconductor TFT in the winding state is improved so that the oxide semiconductor TFT can be applied to the bendable device. The invention also provides a manufacturing method of oxide semiconductor TFT, able to reduce the power consumption of the oxide semiconductor TFT and improve the stability of the oxide semiconductor TFT in a winding state.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. An oxide semiconductor thin film transistor (TFT), comprising: a substrate, a gate disposed on the substrate, a gate insulating layer disposed on the gate and the substrate, an oxide semiconductor layer disposed on the gate insulating layer, and a barrier layer disposed on the semiconductor layer, and a source and a drain disposed on the oxide semiconductor layer and the gate insulating layer;

the oxide semiconductor layer comprising: a channel region and two contact regions respectively located at two sides of the channel region, wherein the source and the drain respectively in contact with the two contact regions, and the barrier layer being located on the channel region;

the channel region comprising a plurality of channel strips spaced apart in a channel width direction, and the barrier layer comprising a plurality of barrier strips respectively corresponding to the plurality of channel strips;

wherein the interface between the channel region and the barrier layer comprises fluoride ions that occupy oxygen vacancies in the channel region.

2. The oxide semiconductor TFT as claimed in claim 1, wherein the substrate is a flexible substrate.

3. The oxide semiconductor TFT as claimed in claim 1, wherein the material of the oxide semiconductor layer is IGZO.

4. The oxide semiconductor TFT as claimed in claim 1, wherein the material of the barrier layer is silicon oxide.

5. A manufacturing method of oxide semiconductor thin film transistor (TFT), comprising:

Step S1: providing a base substrate, forming a substrate on the base substrate;

Step S2: forming a gate on the substrate, forming a gate insulating layer on the gate and the substrate;

Step S3: forming an oxide semiconductor film on the gate insulating layer, and forming a barrier film on the oxide semiconductor film;

Step S4: patterning the oxide semiconductor film and the barrier film to obtain an oxide semiconductor layer and a barrier layer; the oxide semiconductor layer comprising: a channel region and two contact regions respectively located at two sides of the channel region, the barrier layer being located on the channel region; the channel region comprising a plurality of channel strips spaced apart in a channel width direction, and the barrier layer comprising a plurality of barrier strips respectively corresponding to the plurality of channel strips;

Step S5: forming a source and a drain on the oxide semiconductor layer and the gate insulating layer, wherein the source and the drain being in contact with the two contact regions, respectively;

wherein in step S4 of patterning the oxide semiconductor film and the barrier film, a fluorine-containing gas is used to etch the barrier film.

6. The manufacturing method of oxide semiconductor TFT as claimed in claim 5, wherein the manufacturing method further comprises a step S6 of baking the barrier layer.

7. The manufacturing method of oxide semiconductor TFT as claimed in claim 5, wherein the substrate is a flexible substrate.

8. The manufacturing method of oxide semiconductor TFT as claimed in claim 5, wherein the material of the channel region is IGZO, and the material of the barrier layer is silicon oxide.

* * * * *